(12) United States Patent
Taguchi et al.

(10) Patent No.: US 7,708,613 B2
(45) Date of Patent: May 4, 2010

(54) METHOD OF PRODUCING LIGHT EMITTING APPARATUS

(75) Inventors: Yuichi Taguchi, Nagano (JP); Masahiro Sunohara, Nagano (JP); Hideaki Sakaguchi, Nagano (JP); Akinori Shiraishi, Nagano (JP); Naoyuki Koizumi, Nagano (JP); Kei Murayama, Nagano (JP); Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 376 days.

(21) Appl. No.: 11/656,580

(22) Filed: Jan. 23, 2007

(65) Prior Publication Data

US 2007/0173165 A1    Jul. 26, 2007

(30) Foreign Application Priority Data

Jan. 24, 2006    (JP)    .............................. 2006-015449

(51) Int. Cl.
 *H01J 1/62* (2006.01)
(52) U.S. Cl. ......................................... 445/24; 313/502
(58) Field of Classification Search ............. 445/23–25; 313/498–512
 See application file for complete search history.

(56) References Cited

U.S. PATENT DOCUMENTS 6,395,564 B1 * 5/2002 Huang

2002/0171911 A1 * 11/2002 Maegawa
2004/0256974 A1 * 12/2004 Mueller-Mach et al. ..... 313/485
2005/0243570 A1 * 11/2005 Chaves et al. ................ 362/551
2006/0054913 A1 * 3/2006 Hadame et al. ............... 257/99
2006/0099449 A1 * 5/2006 Amano et al. ............... 428/690

FOREIGN PATENT DOCUMENTS

| DE | 298 20 384 U1 | * | 1/1999 |
| EP | 1 408 559 A2 | * | 4/2004 |
| JP | 2003-110146 | | 4/2003 |
| WO | 2005/025831 A1 | * | 3/2005 |

OTHER PUBLICATIONS

European Search Report: EP 07 25 0262.*

* cited by examiner

*Primary Examiner*—Bumsuk Won
(74) *Attorney, Agent, or Firm*—Ladas & Parry LLP

(57) ABSTRACT

A method of producing a light emitting apparatus including a light emitting element, a light emitting element housing having a recess for housing the light emitting element, and a translucent substrate placed on the light emitting element housing is disclosed. The disclosed method includes a fluorescent-substance-containing resin forming step of forming a fluorescent-substance-containing resin on a first side of the translucent substrate which first side is opposite to a second side of the translucent substrate which second side faces the recess. In the fluorescent-substance-containing resin forming step, luminance and chromaticity of light that is emitted from the light emitting element and then transmitted by the fluorescent-substance-containing resin are measured and a thickness of the fluorescent-substance-containing resin is adjusted based on the measured luminance and chromaticity so that light emitted from the light emitting apparatus attains the specified luminance and chromaticity.

4 Claims, 21 Drawing Sheets

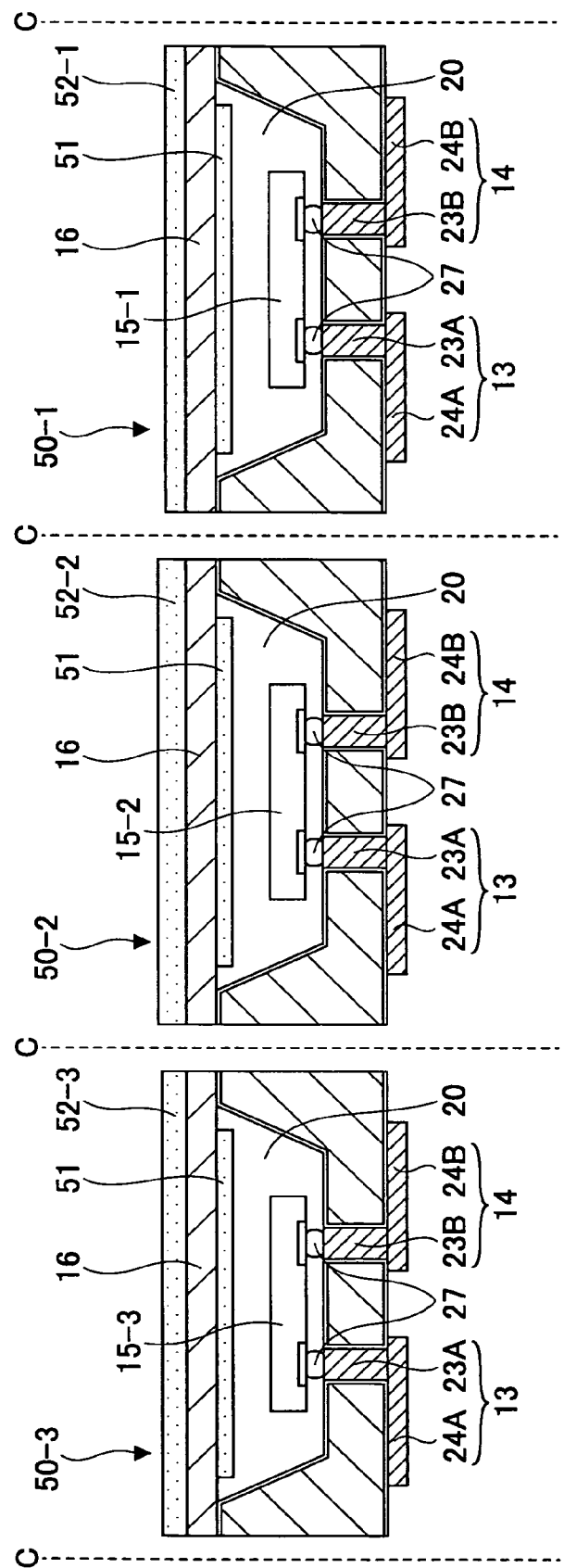

METHOD OF PRODUCING LIGHT EMITTING APPARATUS

BACKGROUND OF THE INVENTION

1. Field of the Invention

The present invention generally relates to a method of producing a light emitting apparatus, and more particularly relates to a method of producing a light emitting apparatus which method makes it possible to adjust the luminance and chromaticity of light emitted from the light emitting apparatus.

2. Description of the Related Art

FIG. 1 is a schematic diagram illustrating a conventional light emitting apparatus.

As shown in FIG. 1, a light emitting apparatus 100 includes a light emitting element housing 101, through-vias (plugs) 102, a light emitting element 103, a translucent substrate 106, and a fluorescent-substance-containing resin 107.

In the light emitting element housing 101, a recess 108 for housing the light emitting element 103 and through holes 109 are formed. The through-vias 102 are formed in the through holes 109 of the light emitting element housing 101. The light emitting element 103 is electrically connected to the through-vias 102 by way of bumps 111.

The translucent substrate 106 is placed on the light emitting element housing 101 so as to close the recess 108. The fluorescent-substance-containing resin 107 is formed on a side 106A (the side facing the light emitting element 103) of the translucent substrate 106.

The light emitting apparatus 100 is preferably configured so that the light emitted from the light emitting element 103 and transmitted by the fluorescent-substance-containing resin 107 (light emitted from the light emitting apparatus 100) has desired luminance and chromaticity.

As described above, the through-vias 102 are formed in the light emitting element housing 101 and the light emitting element 103 is electrically connected to the through-vias 102. The light emitting apparatus 100 is produced by bonding the translucent substrate 106, on which the fluorescent-substance-containing resin 107 is preformed, onto the light emitting element housing 101 having the above structure (see, for example, patent document 1).

[Patent document 1] Japanese Patent Application Publication No. 2003-110146

Meanwhile, when there are multiple light emitting elements 103, their characteristics (such as luminance and chromaticity of emitted light) may not necessarily be the same. Therefore, when producing multiple light emitting apparatuses 100, it is necessary to adjust the thickness of the fluorescent-substance-containing resin 107 for each of the light emitting apparatuses 100 to obtain the desired luminance and chromaticity of emitted light.

However, since the fluorescent-substance-containing resin 107 is formed on the side 106A of the translucent substrate 106 which side 106A faces the light emitting element 103, it is difficult to adjust the thickness of the fluorescent-substance-containing resin 107 so that the light emitted from the light emitting apparatus 100 attains the desired luminance and chromaticity. Also, this difficulty results in a low yield rate of the light emitting apparatus 100.

SUMMARY OF THE INVENTION

The present invention provides a method of producing a light emitting apparatus that substantially obviates one or more problems caused by the limitations and disadvantages of the related art.

Embodiments of the present invention provide a method of producing a light emitting apparatus that makes it possible to adjust the thickness of a fluorescent-substance-containing resin so that the light emitted from a light emitting apparatus attains the desired luminance and chromaticity.

According to an embodiment of the present invention, a method of producing a light emitting apparatus including a light emitting element, a light emitting element housing having a recess for housing the light emitting element, and a translucent substrate placed on the light emitting element housing includes a fluorescent-substance-containing resin forming step of forming a fluorescent-substance-containing resin on a first side of the translucent substrate which first side is opposite to a second side of the translucent substrate which second side faces the recess, wherein the luminance and chromaticity of light that is emitted from the light emitting element and then transmitted by the fluorescent-substance-containing resin are measured, and the thickness of the fluorescent-substance-containing resin is adjusted based on the measured luminance and chromaticity so that light emitted from the light emitting apparatus attains the specified luminance and chromaticity.

BRIEF DESCRIPTION OF THE DRAWINGS

FIG. 21 is a fourth drawing illustrating the exemplary method of producing the exemplary light emitting apparatus according to the second embodiment of the present invention.

DESCRIPTION OF THE PREFERRED EMBODIMENTS

Preferred embodiments of the present invention are described below with reference to the accompanying drawings.

First Embodiment

Figure 1:
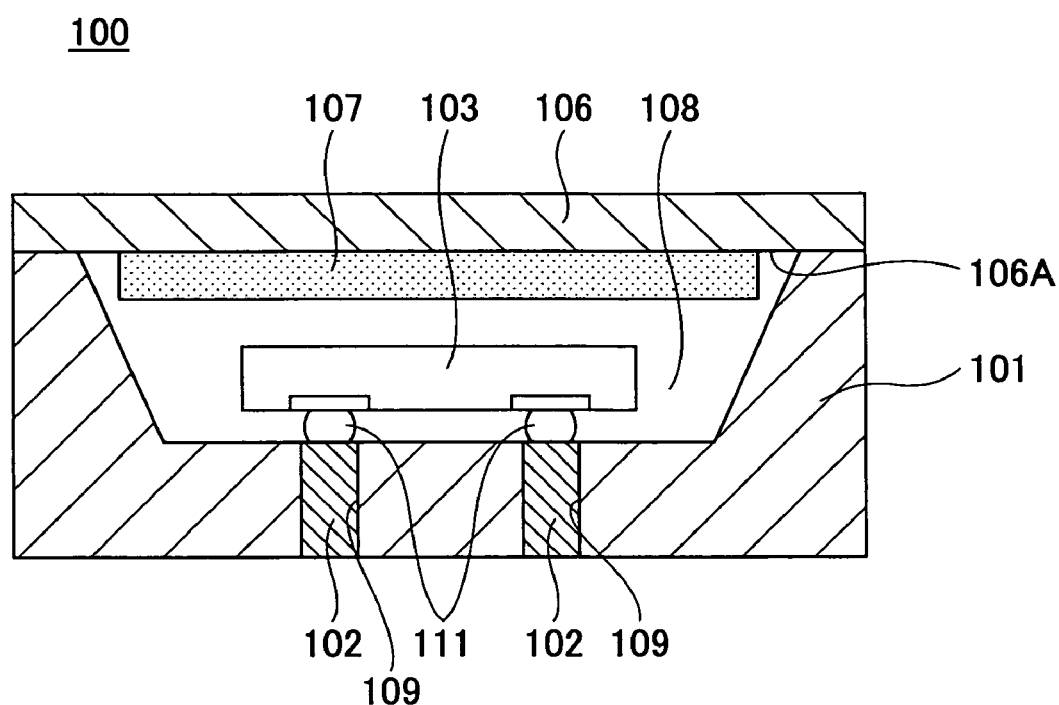
FIG. 1 is a schematic diagram illustrating a conventional light emitting apparatus.
Figure 2:
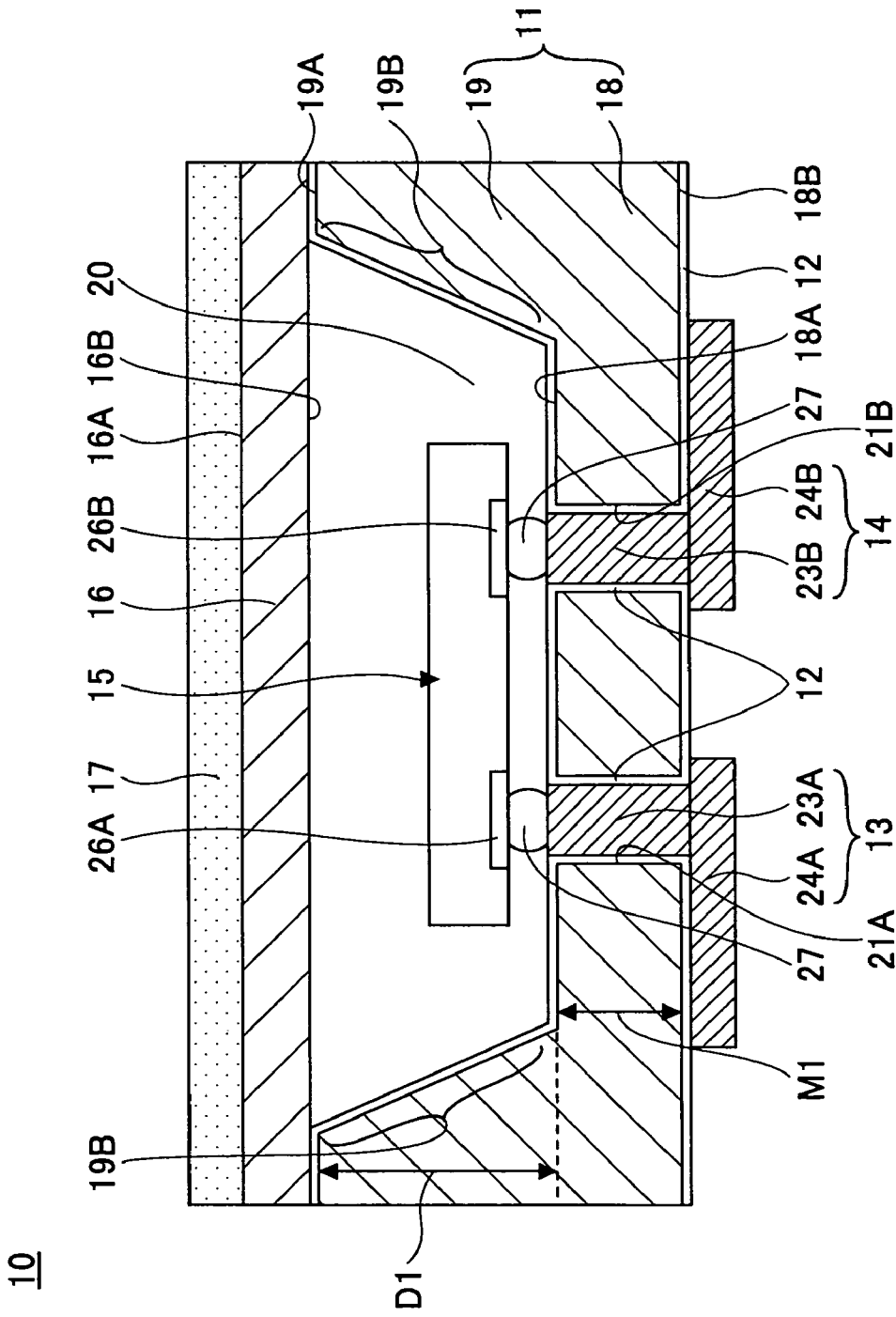
FIG. 2 is a schematic diagram illustrating an exemplary light emitting apparatus according to a first embodiment of the present invention.

FIG. 2 is a schematic diagram illustrating an exemplary light emitting apparatus according to a first embodiment of the present invention.

As shown in FIG. 2, a light emitting apparatus 10 includes a light emitting element housing 11, an insulating film 12, wiring patterns 13 and 14, a light emitting element 15, a translucent substrate 16, and a fluorescent-substance-containing resin 17.

The light emitting element housing 11 includes a plate part 18, a frame part 19, and a recess 20. The plate part 18 supports the frame part 19 and the plate part 18 and the frame part 19 are formed as a monolithic structure. Through holes 21A and 21B are formed in the plate part 18. A thickness M1 of the plate part 18 is, for example, 200 μm. The frame part 18 is monolithically formed on the plate part 19. An inner wall 19B of the frame part 19 is inclined.

The recess 20 houses the light emitting element 15 and is formed by an upper surface 18A of the plate part 18 and the inner wall 19B of the frame part 19. The opening area of the recess 20 increases as it becomes further from the upper surface 18A of the plate part 18 and closer to an upper surface 19A of the frame part 19. A depth D1 of the recess 20 is, for example, 200 μm. As the material of the light emitting element housing 11 (the base material used to form the light emitting element housing 11), for example, silicon or glass may be used.

The insulating film 12 is formed to coat the upper surface 18A and a lower surface 18B of the plate part 18, inner surfaces of the through holes 21A and 21B, and the upper surface 19A and the inner wall 19B of the frame part 19. The insulating film 12 provides insulation between the light emitting element housing 11 and the wiring patterns 13 and 14. As the insulating film 12, for example, an oxide film may be used. The thickness of the insulating film 12 is, for example, 1 μm. When an insulating material (such as glass) is used for the light emitting element housing 11, the insulating film 12 may not be necessary.

The wiring pattern 13 includes a via (plug) 23A and wiring 24A. The via 23A is placed in the through hole 21A the inner surface of which is coated with the insulating film 12. The upper end of the via 23A is electrically connected to an electrode 26A of the light emitting element 15 and the lower end of the via 23A is connected to the wiring 24A. As the material of the via 23A, for example, a conductive metal such as Cu may be used.

The wiring 24A is provided on the lower surface 18B of the plate part 18 which lower surface 18B is coated with the insulating film 12. The wiring 24A is connected to the lower end of the via 23A. In other words, the wiring 24A is electrically connected to the electrode 26A of the light emitting element 15 by way of the via 23A and a bump 27. The wiring 24A functions as an external connecting terminal of the light emitting apparatus 10. As the material of the wiring 24A, for example, a conductive metal may be used. For example, an Ni/Au multilayer film, which is formed by stacking an Ni layer and an Au layer on the insulating film 12 in the order mentioned, may be used as the conductive metal.

The wiring pattern 14 includes a via 23B and wiring 24B. The via 23B is placed in the through hole 21B the inner surface of which is coated with the insulating film 12. The upper end of the via 23B is electrically connected to an electrode 26B of the light emitting element 15 through another bump 27 and the lower end of the via 23B is connected to the wiring 24B. As the material of the via 23B, for example, a conductive metal such as Cu may be used.

The wiring 24B is provided on the lower surface 18B of the plate part 18 which lower surface 18B is coated with the insulating film 12. The wiring 24B is connected to the lower end of the via 23B. In other words, the wiring 24B is electrically connected to the electrode 26B of the light emitting element 15 by way of the via 23B and one of the bumps 27. The wiring 24B functions as an external connecting terminal of the light emitting apparatus 10. As the material of the wiring 24B, for example, a conductive metal may be used. For example, an Ni/Au multilayer film, which is formed by stacking an Ni layer and an Au layer on the insulating film 12 in the order mentioned, may be used as the conductive metal.

The light emitting element 15 is housed in the recess 20 of the light emitting element housing 11 and is connected to the wiring patterns 13 and 14 by using a flip chip technique. The light emitting element 15 emits light of a specific color and includes the electrodes 26A and 26B. One of the electrodes 26A and 26B is used as a positive electrode and the other is used as a negative electrode. The electrode 26A is electrically connected to the wiring pattern 13 via one of the bumps 27. The electrode 26B is electrically connected to the wiring pattern 14 via the other one of the bumps 27.

In other words, the light emitting element 15 is electrically connected to the wiring patterns 13 and 14. As the light emitting element 15, for example, a light emitting diode (LED) may be used. For example, when producing a light emitting apparatus 10 that emits white light, a blue light emitting diode may be used as the light emitting element 15.

The translucent substrate 16 is placed on the upper surface 19A of the frame part 19, which upper surface 19A is coated with the insulating film 12, so as to close the recess 20. As the translucent substrate 16, for example, a glass substrate may be used. The translucent substrate 16 and the upper surface 19A are bonded, for example, with an adhesive (not shown) or by anodic bonding.

The fluorescent-substance-containing resin 17 is formed on a side 16A (the side opposite to a side 16B that faces the recess 20) of the translucent substrate 16. The fluorescent-substance-containing resin 17 is made of a translucent resin containing fluorescent particles. The thickness of the fluorescent-substance-containing resin 17 is determined so that the light emitted from the light emitting apparatus 10 attains the desired luminance and chromaticity.

As described above, the fluorescent-substance-containing resin 17 is formed so as to cover the side 16A of the translucent substrate 16. With this structure, most of light emitted from the light emitting element 15 passes through the fluorescent-substance-containing resin 17. In other words, this structure makes it possible to effectively control the luminance and chromaticity of light emitted from the light emitting apparatus 10.

Examples of translucent resins usable as the material of the fluorescent-substance-containing resin 17 include epoxy resins and acrylic resins. For example, when producing a light emitting apparatus 10 that emits white light, yellow-light emitting fluorescent particles made of, for example, a YAG fluorescent substance may be used as the fluorescent particles in the fluorescent-substance-containing resin 17. The average particle diameter of the fluorescent particles is, for example, 20 µm.

Figure 3:
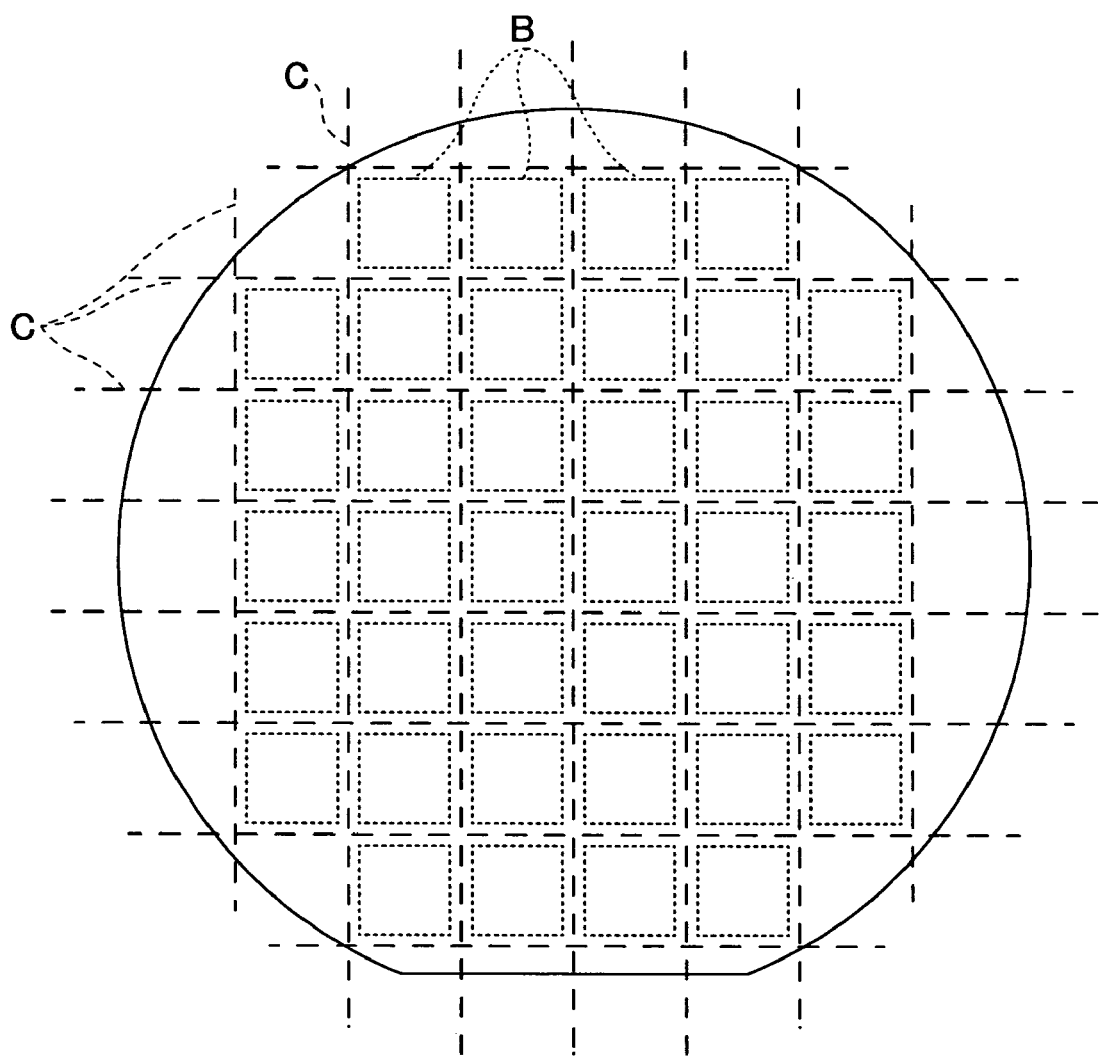
FIG. 3 is a plan view of a base material used to produce the exemplary light emitting apparatus according to the first embodiment of the present invention.

FIG. 3 is a plan view of a base material 30 used to produce the light emitting apparatus 10 according to the first embodiment of the present invention. In FIG. 3, B indicates areas (hereafter called light emitting apparatus forming areas B) in each of which the light emitting apparatus 10 is to be formed and C indicates positions (hereafter called cutting positions C) at which the base material 30 is to be cut into pieces.

The light emitting apparatus 10 is formed in each of the light emitting apparatus forming areas B of the base material 30. As the base material 30, for example, a silicon wafer or a glass substrate may be used.

FIGS. 4 through 16 are drawings illustrating an exemplary method of producing the light emitting apparatus 10 according to the first embodiment of the present invention. In FIGS. 4 through 16, the same reference numbers are used for the parts corresponding to those of the light emitting apparatus 10 shown in FIG. 2.

The exemplary method of producing the light emitting apparatus 10 according to the first embodiment of the present invention is described below with reference to FIGS. 4 through 16. Here, light emitting apparatuses 10-1 through 10-3 are used to describe the exemplary method. FIGS. 4 through 16 illustrate exemplary steps of producing light emitting apparatuses 10-1 through 10-3 using the base material 30 shown in FIG. 3. Each of the light emitting apparatuses 10-1 through 10-3 has substantially the same configuration as that of the light emitting apparatus 10 shown in FIG. 2 except that light emitting elements 15-1 through 15-3 of the light emitting apparatuses 10-1 through 10-3 have different characteristics in luminance and chromaticity.

Figure 4:
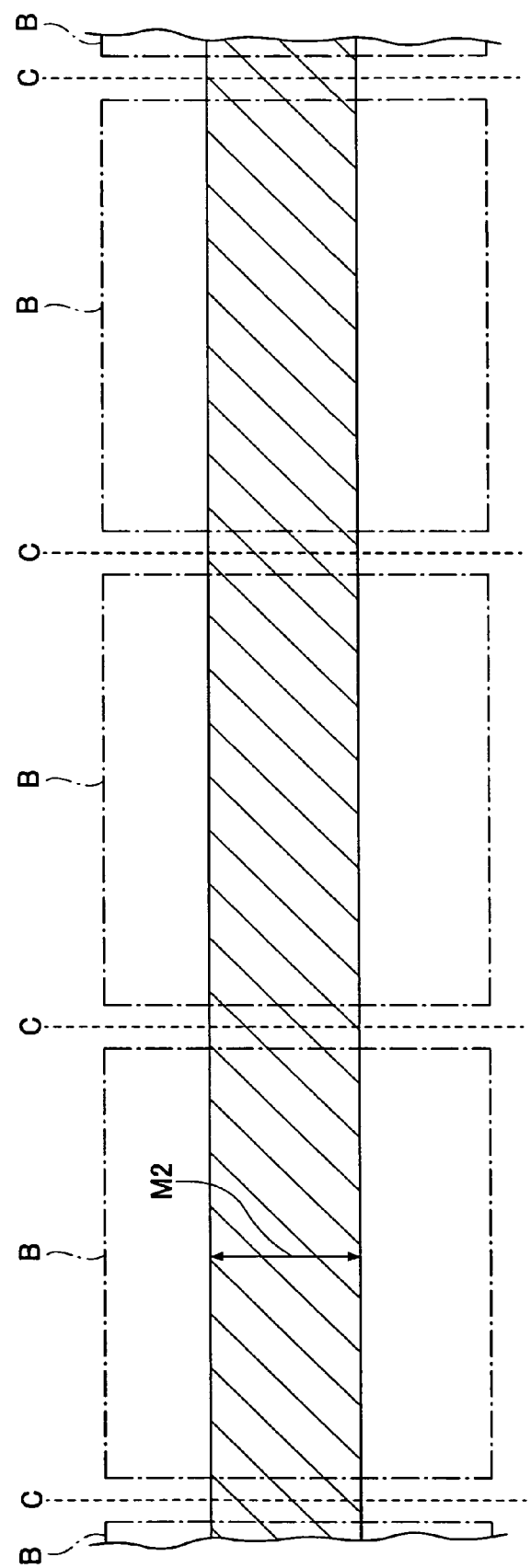
FIG. 4 is a first drawing illustrating an exemplary method of producing the exemplary light emitting apparatus according to the first embodiment of the present invention.

In a step shown in FIG. 4, the base material 30 having the light emitting apparatus forming areas B is prepared. As the base material 30, for example, a silicon wafer or a glass substrate may be used. A thickness M2 of the base material 30 is, for example, 400 µm. In the descriptions below, it is assumed that a silicon wafer is used as the base material 30.

Figure 5:
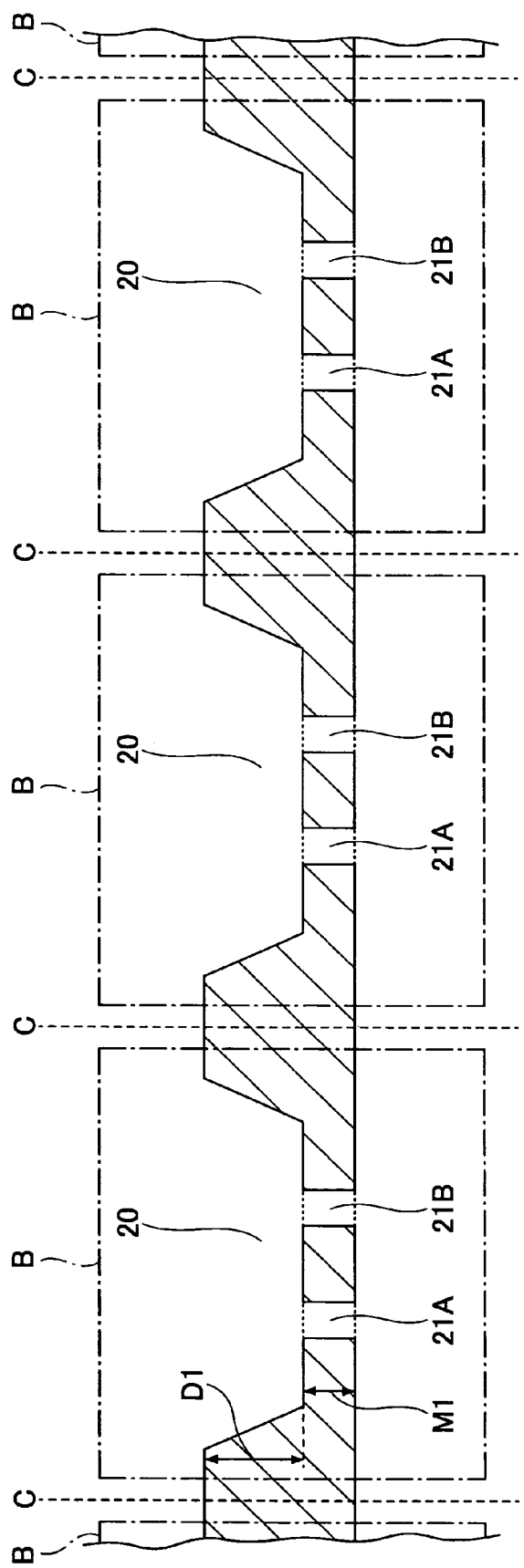
FIG. 5 is a second drawing illustrating the exemplary method of producing the exemplary light emitting apparatus according to the first embodiment of the present invention.

In a step shown in FIG. 5, the through holes 21A and 21B and the recess 20 are formed by etching in each of the light emitting apparatus forming areas B of the base material 30. As a result, multiple light emitting element housings 11 are formed in the base material 30. The depth D1 of the recess 20 is, for example, 200 µm. The thickness M1 of a part used as the plate part 18 is, for example, 200 µm.

Figure 6:
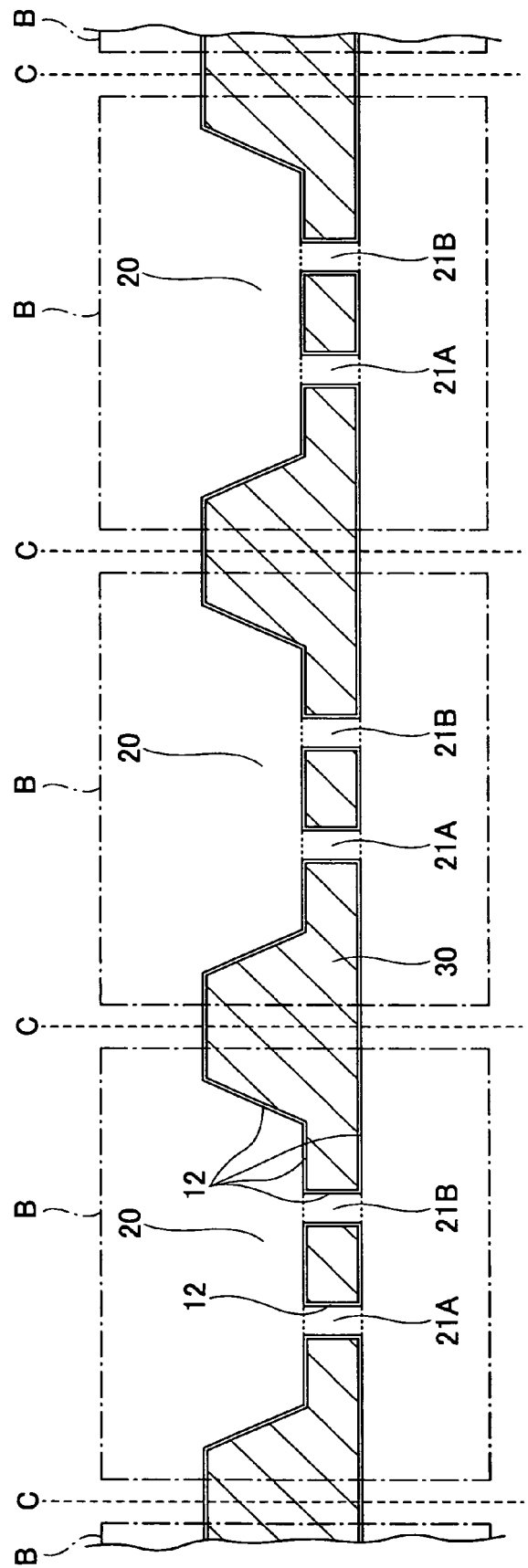
FIG. 6 is a third drawing illustrating the exemplary method of producing the exemplary light emitting apparatus according to the first embodiment of the present invention.

In a step shown in FIG. 6, the insulating film 12 is formed so as to coat the surfaces (including the inner surfaces of the through holes 21A and 21B) of the base material 30. As the insulating film 12, for example, an oxide film may be used. For example, when the base material 30 is made of a silicon wafer, the insulating film 12 may be formed by thermally-oxidizing the structure shown in FIG. 5. The thickness of the insulating film 12 is, for example, 1 µm.

Figure 7:
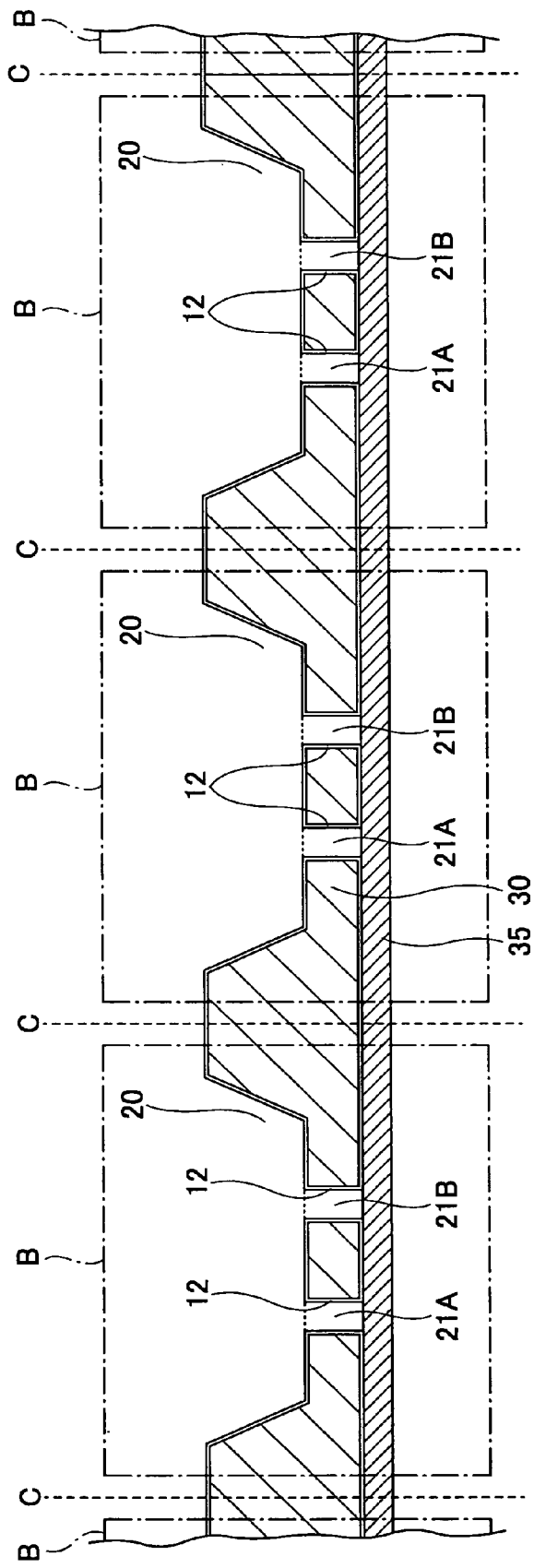
FIG. 7 is a fourth drawing illustrating the exemplary method of producing the exemplary light emitting apparatus according to the first embodiment of the present invention.

In a step shown in FIG. 7, metal foil 35 is affixed to the lower surface of the structure shown in FIG. 6. The metal foil 35 functions as a power supply layer when depositing a metal film in each of the through holes 21A and 21B by electrolytic plating. As the metal foil 35, for example, Cu foil may be used.

Figure 8:
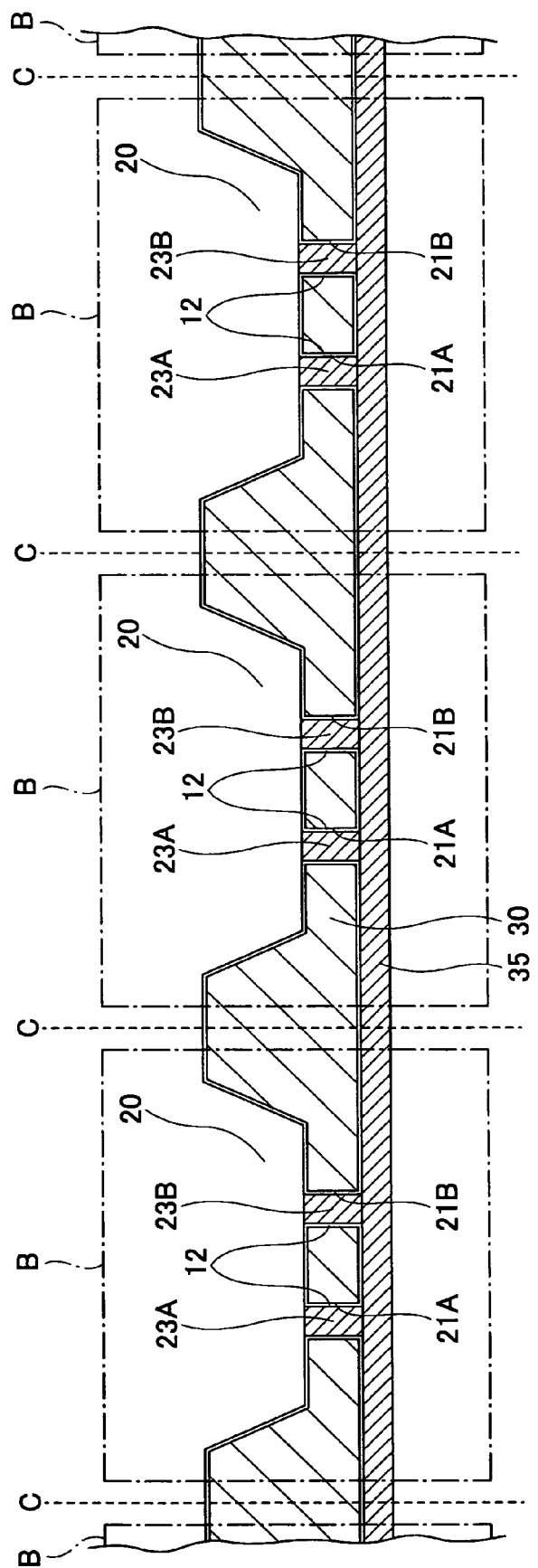
FIG. 8 is a fifth drawing illustrating the exemplary method of producing the exemplary light emitting apparatus according to the first embodiment of the present invention.

In a step shown in FIG. 8, metal films are deposited by electrolytic plating so as to fill the through holes 21A and 21B. The deposited metal films are used as the vias 23A and 23B. As the metal film to fill each of the through holes 21A and 21B, for example, a Cu film may be used. In a step shown in FIG. 9, the metal foil 35 is removed by etching.

Figure 9:
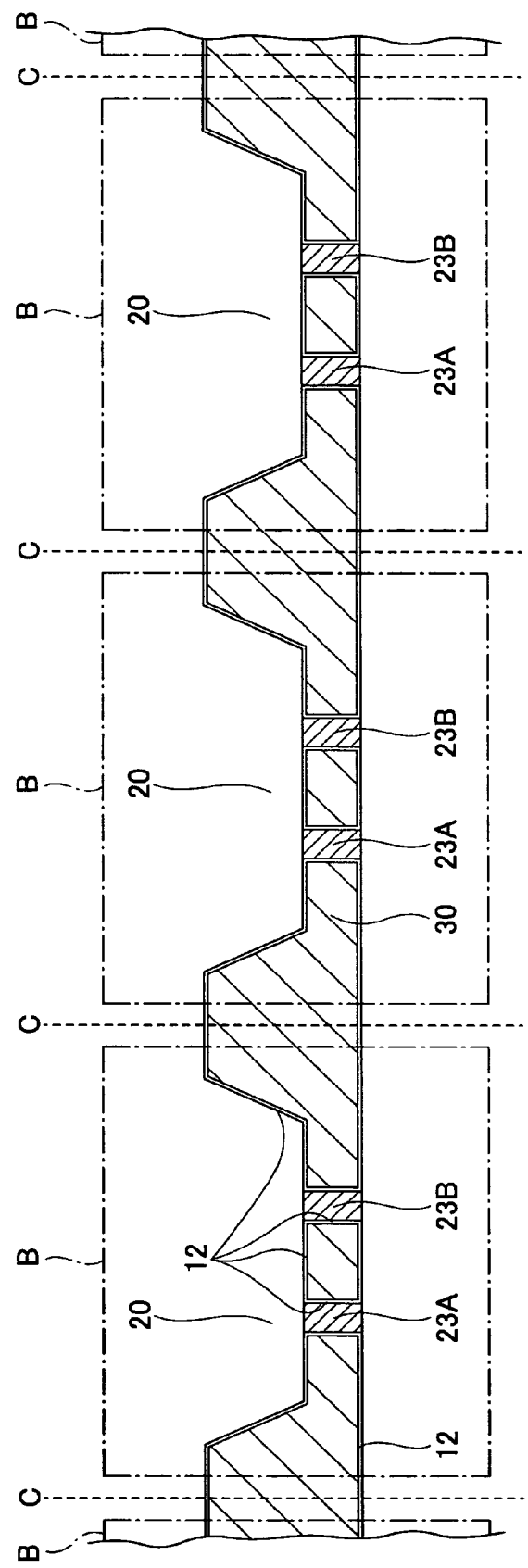
FIG. 9 is a sixth drawing illustrating the exemplary method of producing the exemplary light emitting apparatus according to the first embodiment of the present invention.
Figure 10:
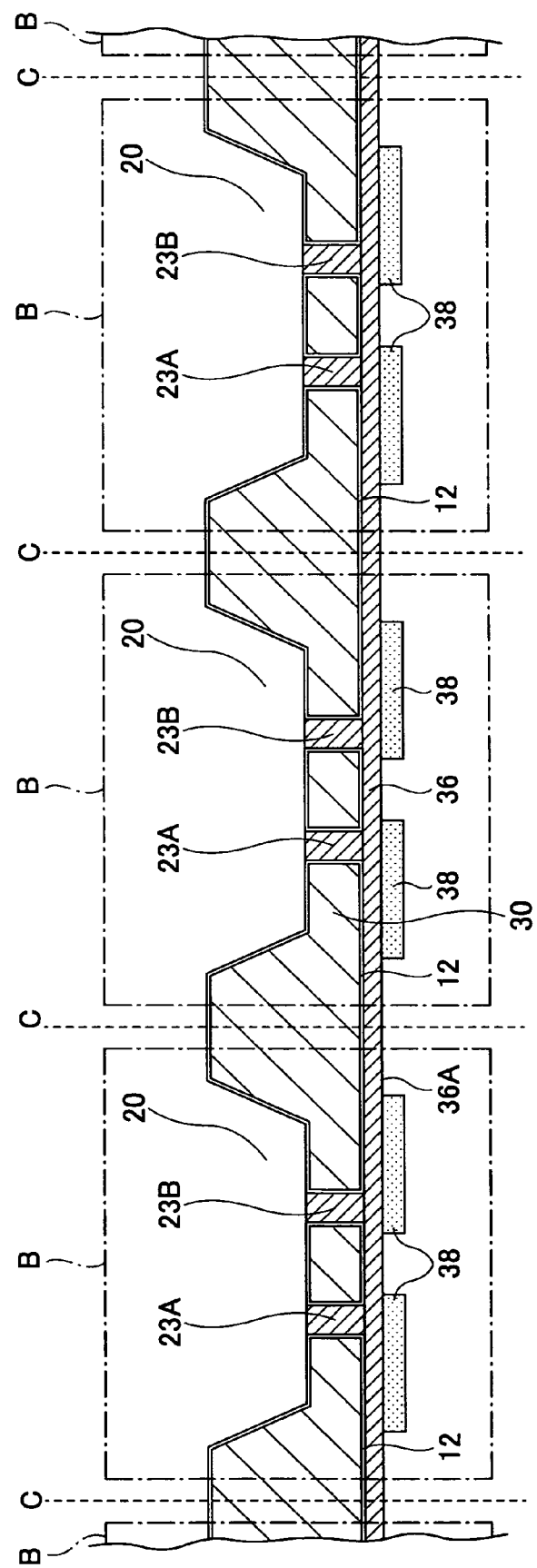
FIG. 10 is a seventh drawing illustrating the exemplary method of producing the exemplary light emitting apparatus according to the first embodiment of the present invention.

In a step shown in FIG. 10, a metal film 36 is formed so as to coat the lower surface of the structure shown in FIG. 9 and then patterned resist films 38 are formed on a side 36A of the metal film 36. The metal film 36 is patterned in a step shown in FIG. 11 to form the wiring 24A and the wiring 24B. The metal film 36 may be formed, for example, by a sputtering method. For example, an Ni/Au multilayer film, which is formed by stacking an Ni layer and an Au layer on the insulating film 12 in the order mentioned, may be used as the metal film 36. The resist films 38 are formed in positions corresponding to the wiring 24A and the wiring 24B and are used as masks when forming the wiring 24A and the wiring 24B by anisotropic etching. As the resist films 38, for example, a dry film resist may be used.

Figure 11:
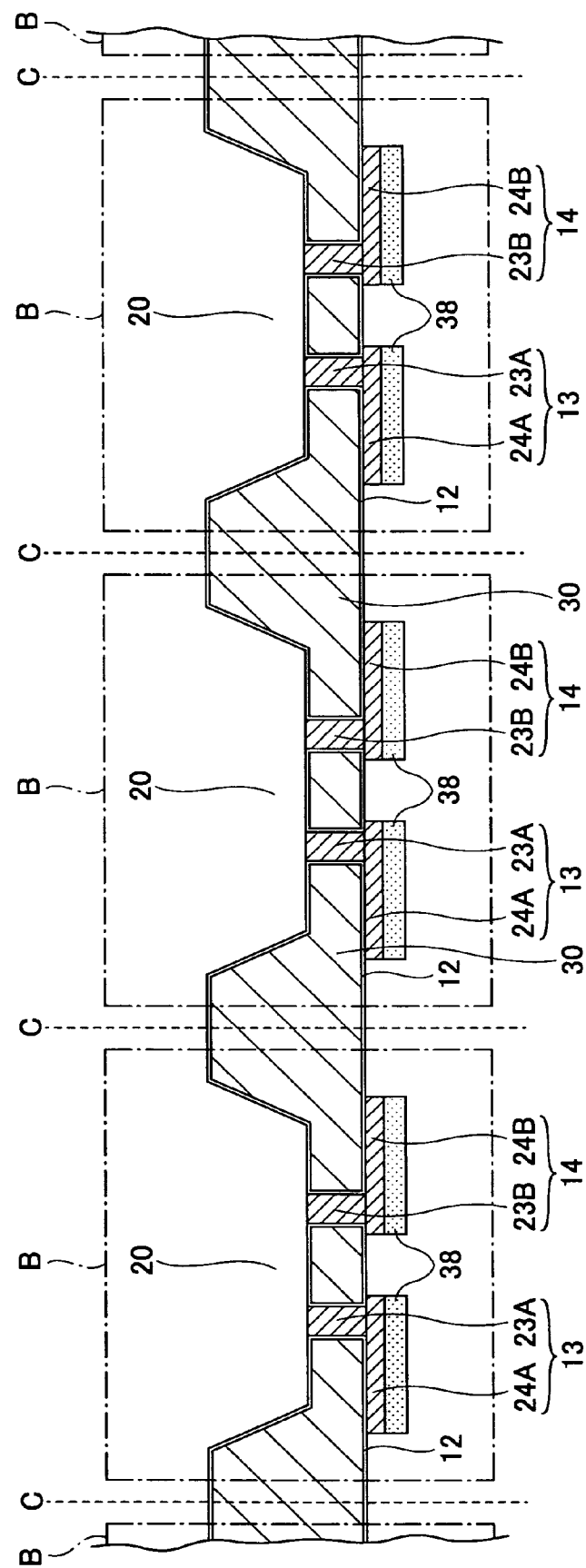
FIG. 11 is an eighth drawing illustrating the exemplary method of producing the exemplary light emitting apparatus according to the first embodiment of the present invention.

In a step shown in FIG. 11, the wiring 24A and the wiring 24B are formed by anisotropically etching the metal film 36 using the resist films 38 as masks until the insulating film 12 is exposed. The via 23A and the wiring 24A form the wiring pattern 13, and the via 23B and the wiring 24B form the wiring pattern 14.

Figure 12:
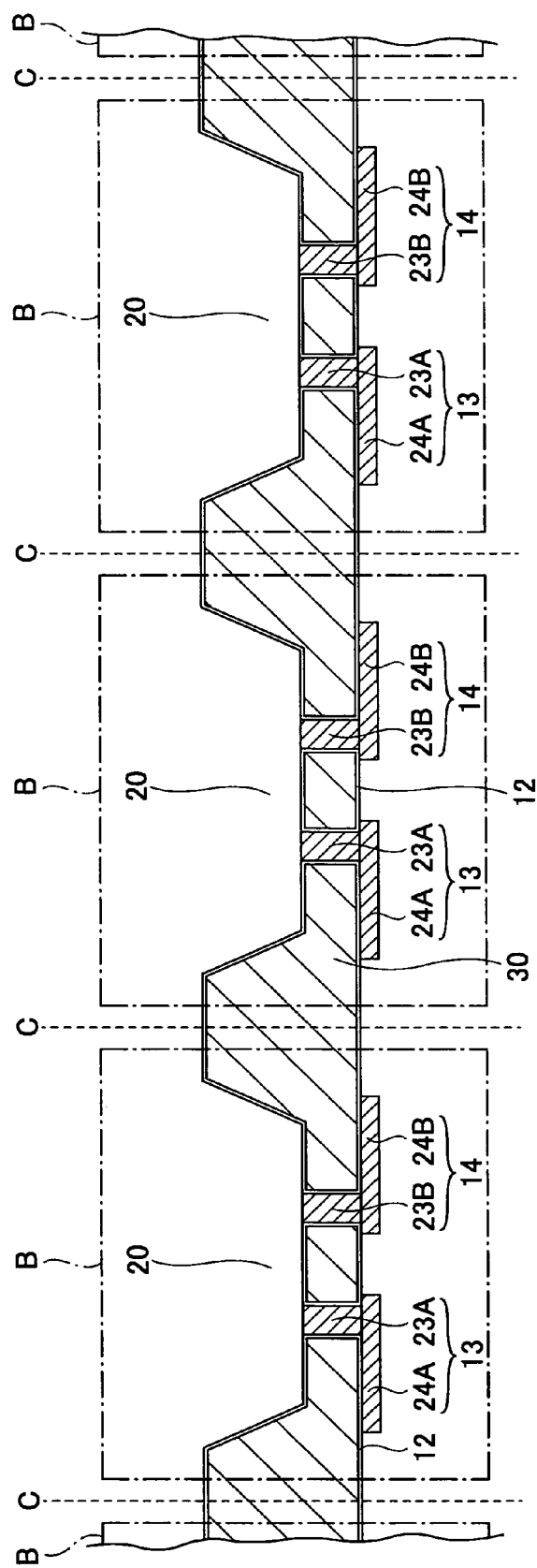
FIG. 12 is a ninth drawing illustrating the exemplary method of producing the exemplary light emitting apparatus according to the first embodiment of the present invention.

In a step shown in FIG. 12, the resist films 38 are removed. In a step shown in FIG. 13, bumps 27 are formed on the upper ends of the vias 23A and 23B and fused to the electrodes 26A and 26B of the light emitting elements 15-1 through 15-3. As a result, the light emitting elements 15-1 through 15-3 are electrically connected to the corresponding wiring patterns 13 and 14. Each of the light emitting elements 15-1 through 15-3 has substantially the same configuration as that of the light emitting element 15 shown in FIG. 2 except that the light emitting elements 15-1 through 15-3 have different characteristics in luminance and chromaticity. For example, when the light emitting apparatuses 10-1 through 10-3 are to emit white light, a blue light emitting diode (LED) may be used for each of the light emitting elements 15-1 through 15-3.

Figure 13:
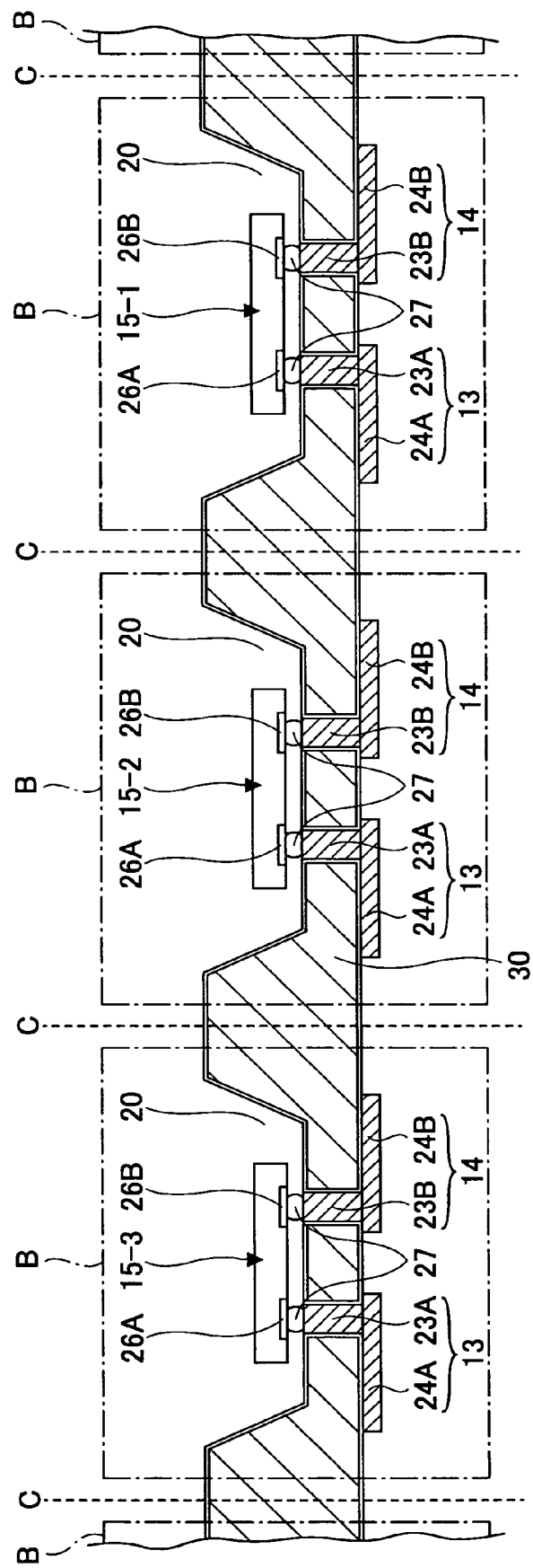
FIG. 13 is a tenth drawing illustrating the exemplary method of producing the exemplary light emitting apparatus according to the first embodiment of the present invention.
Figure 14:
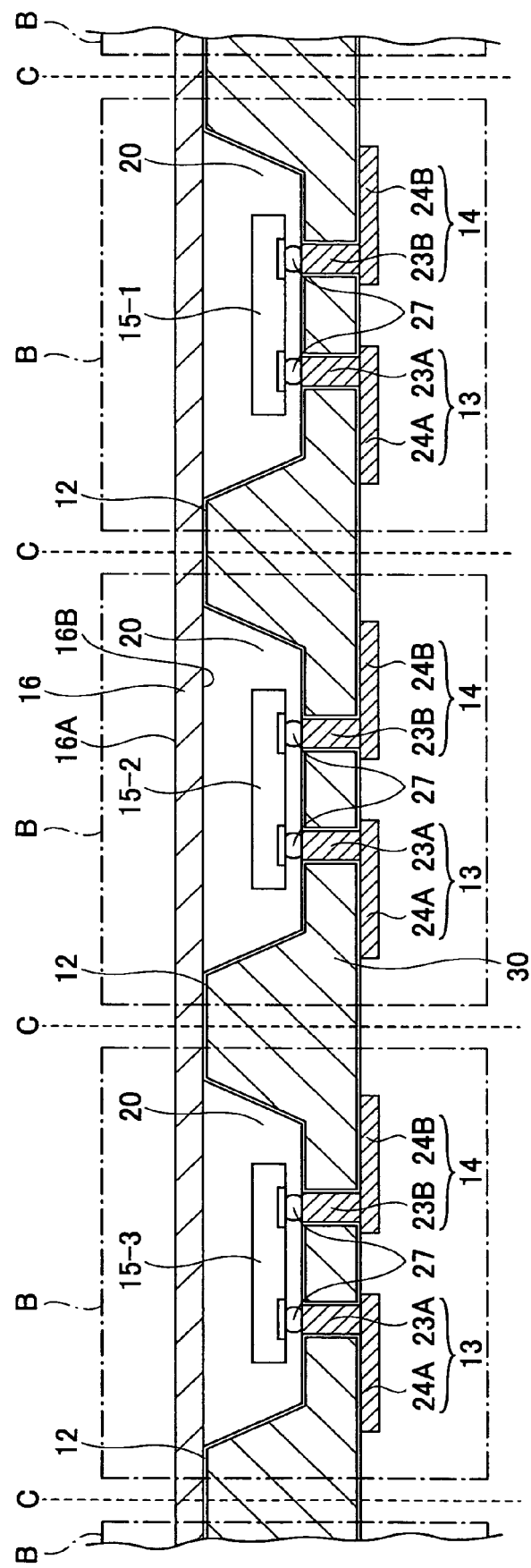
FIG. 14 is an eleventh drawing illustrating the exemplary method of producing the exemplary light emitting apparatus according to the first embodiment of the present invention.

In a step shown in FIG. 14, the translucent substrate 16 is bonded to the structure (to the base material 30 coated with the insulating film 12) shown in FIG. 13. As a result, the recesses 20 are closed by the translucent substrate 16. To bond the base material 30 and the translucent substrate 16, for example, an adhesive (not shown) may be used. When the base material 30 is made of silicon, the base material 30 and the translucent substrate 16 may also be bonded by anodic bonding. In anodic bonding, the base material 30 is softened by heat and a high voltage is applied between the base material 30 and the translucent substrate 16 with the base material 30 as an anode to form an electric double layer. As a result, the base material 30 and the translucent substrate 16 are bonded by electrostatic attraction.

Figure 15:
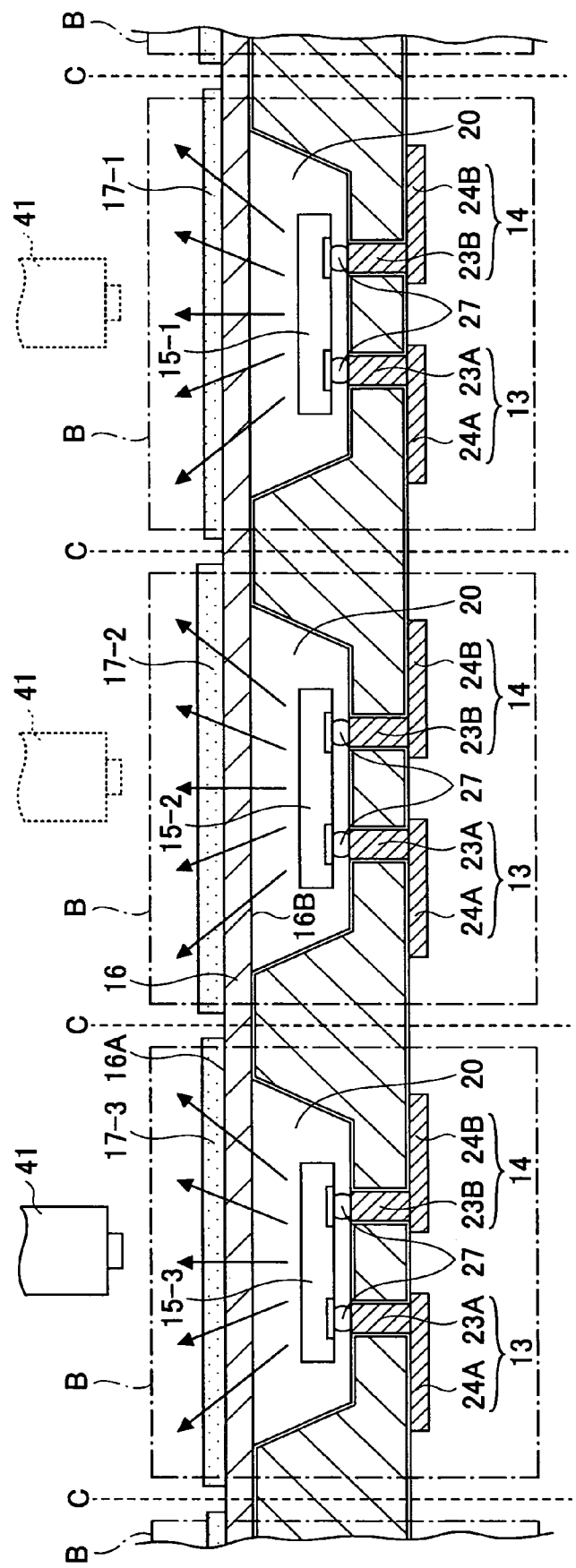
FIG. 15 is a twelfth drawing illustrating the exemplary method of producing the exemplary light emitting apparatus according to the first embodiment of the present invention.

In a step shown in FIG. 15, a voltage is applied between the electrodes 26A and 26B to cause the light emitting elements 15-1 through 15-3 one by one to emit light. Each of fluorescent-substance-containing resins 17-1 through 17-3 is formed on the side 16A (the side opposite to the side 16B that faces the recess 20) of the translucent substrate 16 while measuring the luminance and chromaticity of the light transmitted by a corresponding one of the fluorescent-substance-containing resins 17-1 through 17-3 (light emitted from a corresponding one of the light emitting apparatuses 10-1 through 10-3) with a measuring device 41 so that the measurement results match the specified luminance and chromaticity (fluorescent-substance-containing resin forming step). Each of the fluorescent-substance-containing resins 17-1 through 17-3 has substantially the same configuration as that of the fluorescent-substance-containing resin 17 shown in FIG. 2 except that the fluorescent-substance-containing resins 17-1 through 17-3 have different thicknesses.

In this embodiment, as described above, the light emitting elements 15-1 through 15-3 are caused to emit light one by one. Each of the fluorescent-substance-containing resins 17-1 through 17-3 is formed while measuring the luminance and chromaticity of the light transmitted by the corresponding one of the fluorescent-substance-containing resins 17-1 through 17-3 (light emitted from the corresponding one of the light emitting apparatuses 10-1 through 10-3) with the measuring device 41 until it reaches a certain thickness at which the measurement results match the specified luminance and chromaticity. Such a production method makes it possible to improve the yield rate of the light emitting apparatuses 10-1 through 10-3.

The fluorescent-substance-containing resins 17-1 through 17-3 may be formed, for example, by inkjet printing. Using inkjet printing makes it easier to adjust the thicknesses of the fluorescent-substance-containing resins 17-1 through 17-3.

As the measuring device 41, for example, a chroma meter such as CS-200 (Konica Minolta Sensing, Inc.) may be used.

Figure 16:
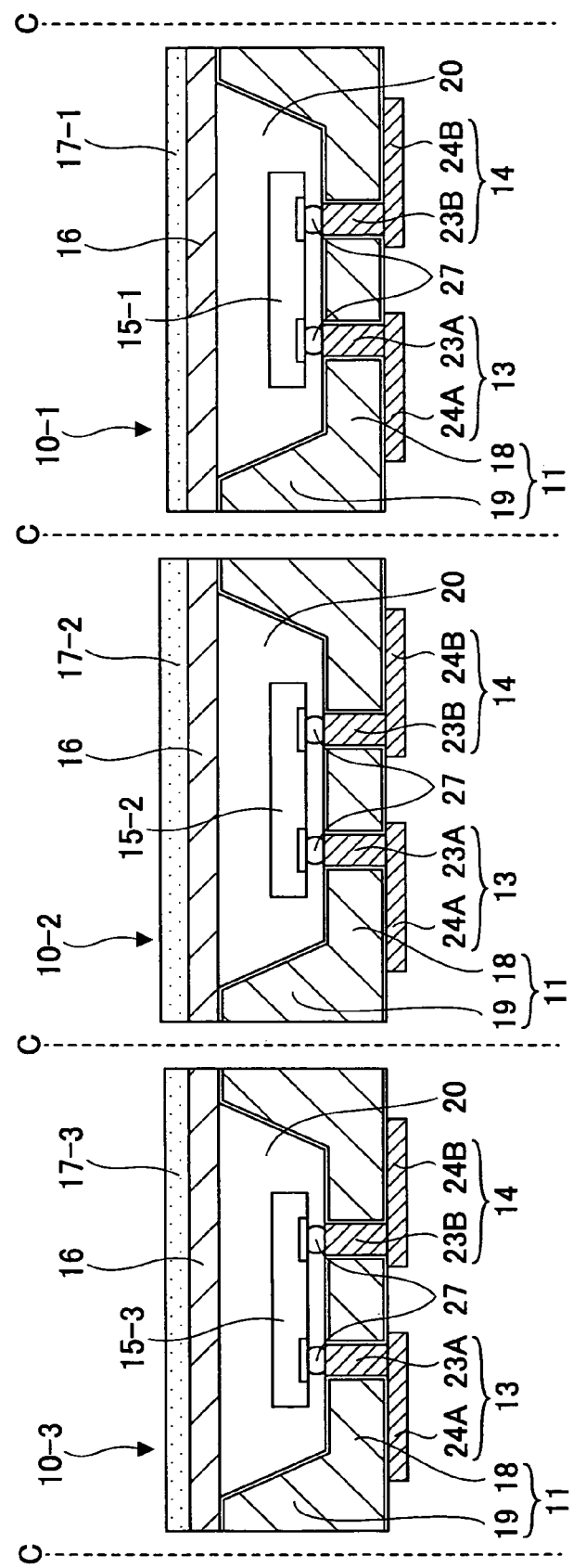
FIG. 16 is a thirteenth drawing illustrating the exemplary method of producing the exemplary light emitting apparatus according to the first embodiment of the present invention.

In a step shown in FIG. 16, the structure shown in FIG. 15 is cut into pieces along the cutting positions C. As a result, the light emitting apparatuses 10-1 through 10-3 that can emit light of specified luminance and chromaticity are produced. To cut the structure shown in FIG. 15, for example, a dicer may be used.

In this embodiment, as described above, the light emitting elements 15-1 through 15-3 are caused to emit light one by one. Each of the fluorescent-substance-containing resins 17-1 through 17-3 is formed while measuring the luminance and chromaticity of the light transmitted by the corresponding one of the fluorescent-substance-containing resins 17-1 through 17-3 (light emitted from the corresponding one of the light emitting apparatuses 10-1 through 10-3) with the measuring device 41 until it reaches a certain thickness at which the measurement results match the specified luminance and chromaticity. Such a production method makes it possible to improve the yield rate of the light emitting apparatuses 10-1 through 10-3.

The light emitting apparatus 10 according to the first embodiment may also include a reflector (for example, a metal film) on the inner wall 19B of the frame part 19 to reflect the light emitted from the light emitting element 15. The above production method may also be applied to a light emitting apparatus with such a configuration.

Second Embodiment

Figure 17:
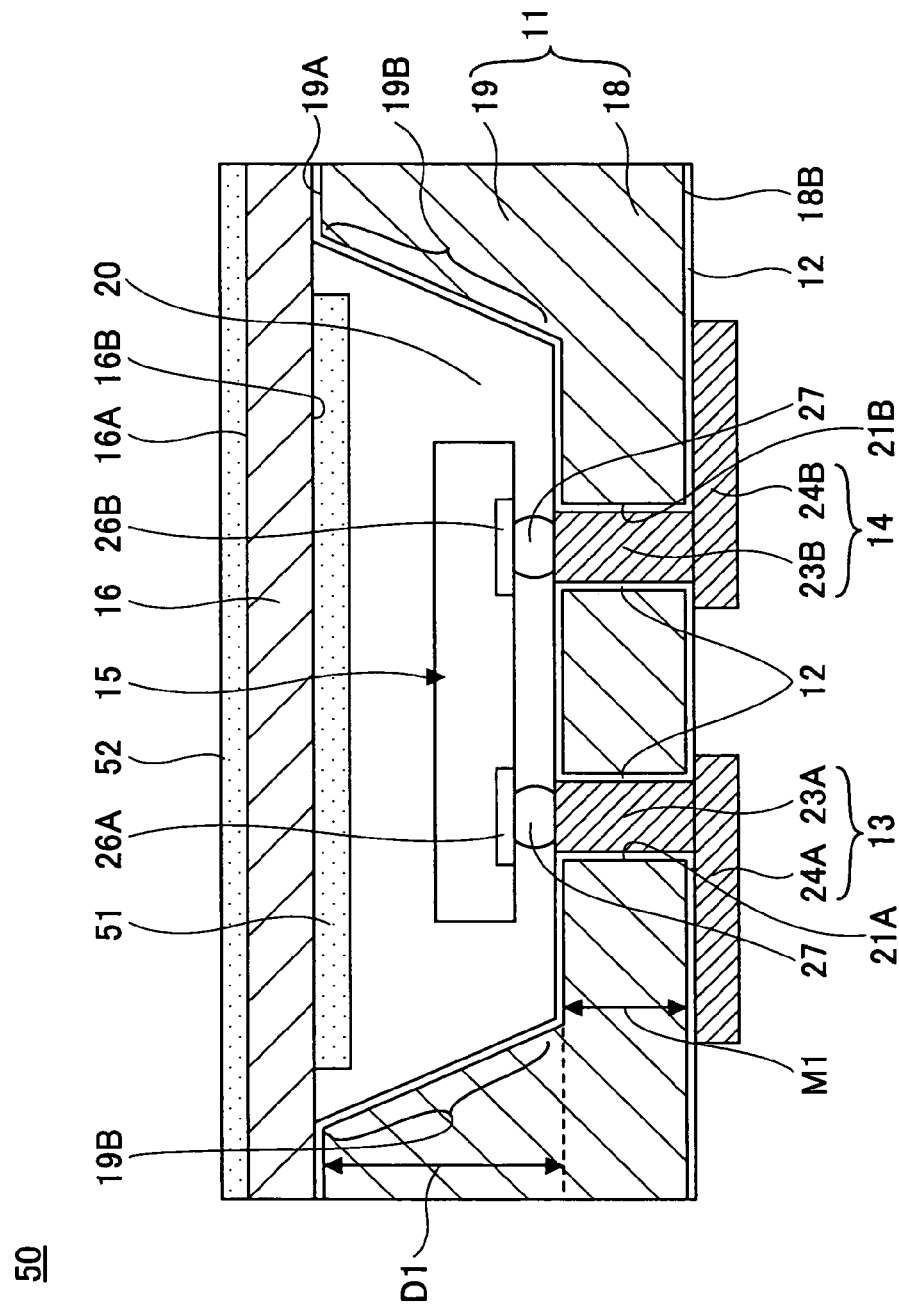
FIG. 17 is a schematic diagram illustrating an exemplary light emitting apparatus according to a second embodiment of the present invention.

FIG. 17 is a schematic diagram illustrating an exemplary light emitting apparatus according to a second embodiment of the present invention. In FIG. 17, the same reference numbers are used for the parts corresponding to those of the light emitting apparatus 10 shown in FIG. 2.

As shown in FIG. 17, a light emitting apparatus 50 according to the second embodiment has substantially the same configuration as that of the light emitting apparatus 10 according to the first embodiment except that a first fluorescent-substance-containing resin 51 and a second fluorescent-substance-containing resin 52 are provided instead of the fluorescent-substance-containing resin 17.

The first fluorescent-substance-containing resin 51 is formed on the side 16B (the side facing the light emitting element 15 in the recess 20) of the translucent substrate 16. The thickness of the first fluorescent-substance-containing resin 51 is determined to be smaller than a thickness (the sum of the thicknesses of the first fluorescent-substance-containing resin 51 and the second fluorescent-substance-containing resin 52) at which the light emitted from the light emitting apparatus 50 attains specified luminance and chromaticity. The first fluorescent-substance-containing resin 51 has substantially the same configuration as that of the fluorescent-substance-containing resin 17 of the first embodiment. The first fluorescent-substance-containing resin 51 may be formed, for example, by squeegee printing, spin coating, a dispensing method, offset printing, or inkjet printing.

The second fluorescent-substance-containing resin 52 is formed on the side 16A (the side opposite to the side 16B that faces the recess 20) of the translucent substrate 16. The thickness of the second fluorescent-substance-containing resin 52 is determined so that the combined thickness of the first and second fluorescent-substance-containing resins 51 and 52 becomes a certain thickness at which the light emitted from the light emitting apparatus 50 attains the specified luminance and chromaticity. The second fluorescent-substance-containing resin 52 has substantially the same configuration as that of the fluorescent-substance-containing resin 17 of the first embodiment. The second fluorescent-substance-containing resin 52 may be formed, for example, by inkjet printing.

Providing the first fluorescent-substance-containing resin 51 on the side 16B of the translucent substrate 16 which side 16B faces the recess 20 makes it possible to reduce the thickness of the second fluorescent-substance-containing resin 52 that is to be formed on the side 16A of the translucent substrate 16. For example, it is possible to form the first fluorescent-substance-containing resin 51 by squeegee printing and the second fluorescent-substance-containing resin 52 by inkjet printing. Such a production method takes less time than a method where both of the first and second fluorescent-substance-containing resins 51 and 52 are formed by inkjet printing and therefore improves the efficiency of producing the light emitting apparatus 50.

FIGS. 18 through 21 are drawings illustrating an exemplary method of producing the light emitting apparatus 50 according to the second embodiment of the present invention. In FIGS. 18 through 21, the same reference numbers are used for the parts corresponding to those of the light emitting apparatus 50 shown in FIG. 17.

The exemplary method of producing the light emitting apparatus 50 according to the second embodiment of the present invention is described below with reference to FIGS. 18 through 21. Here, light emitting apparatuses 50-1 through 50-3 are used to describe the exemplary method. FIGS. 18 through 21 illustrate exemplary steps of producing the light emitting apparatuses 50-1 through 50-3 using the base material 30 shown in FIG. 3. Each of the light emitting apparatuses 50-1 through 50-3 has substantially the same configuration as that of the light emitting apparatus 50 shown in FIG. 17 except that light emitting elements 15-1 through 15-3 of the light emitting apparatuses 50-1 through 50-3 have different characteristics in luminance and chromaticity.

Figure 18:
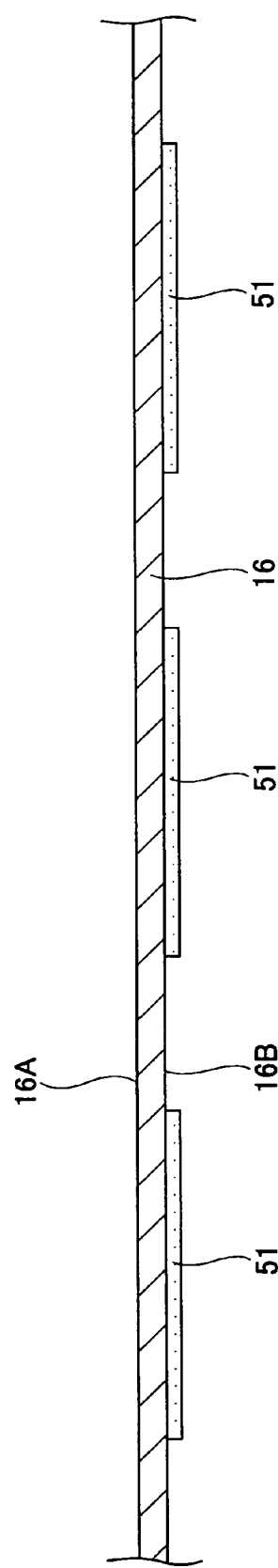
FIG. 18 is a first drawing illustrating an exemplary method of producing the exemplary light emitting apparatus according to the second embodiment of the present invention.

In a step shown in FIG. 18, the first fluorescent-substance-containing resins 51 are formed on the side B of the translucent substrate 16 before it is cut into pieces. The first fluorescent-substance-containing resin 51 may be formed, for example, by squeegee printing, spin coating, a dispensing method, offset printing, or inkjet printing. The first fluorescent-substance-containing resin 51 has substantially the same configuration as that of the fluorescent-substance-containing resin 17 of the first embodiment.

Figure 19:
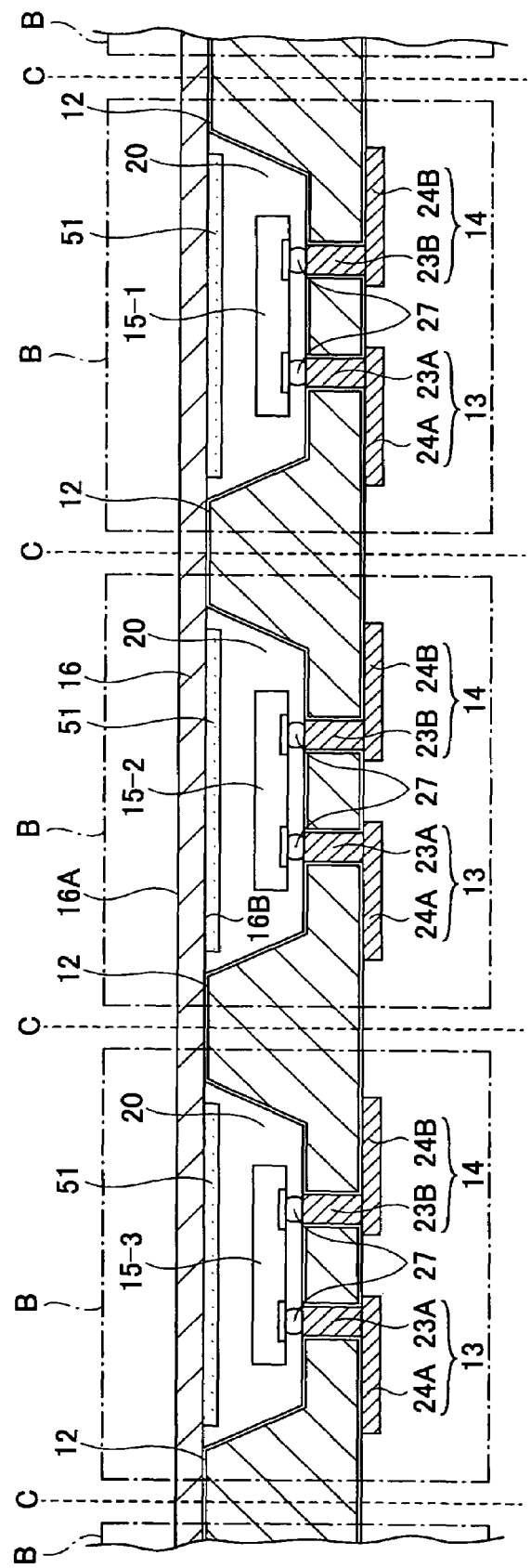
FIG. 19 is a second drawing illustrating the exemplary method of producing the exemplary light emitting apparatus according to the second embodiment of the present invention.

In a step shown in FIG. 19, the structure shown in FIG. 18 is bonded to the structure shown in FIG. 13. As a result, the recesses 20 are closed by the translucent substrate 16. To bond the base material 30 coated with the insulating film 12 and the translucent substrate 16, for example, an adhesive (not shown) may be used. When the base material 30 is made of silicon, the base material 30 and the translucent substrate 16 may also be bonded by anodic bonding. In anodic bonding, the base material 30 is softened by heat and a high voltage is applied between the base material 30 and the translucent substrate 16 with the base material 30 as an anode to form an electric double layer. As a result, the base material 30 and the translucent substrate 16 are bonded by electrostatic attraction.

Figure 20:
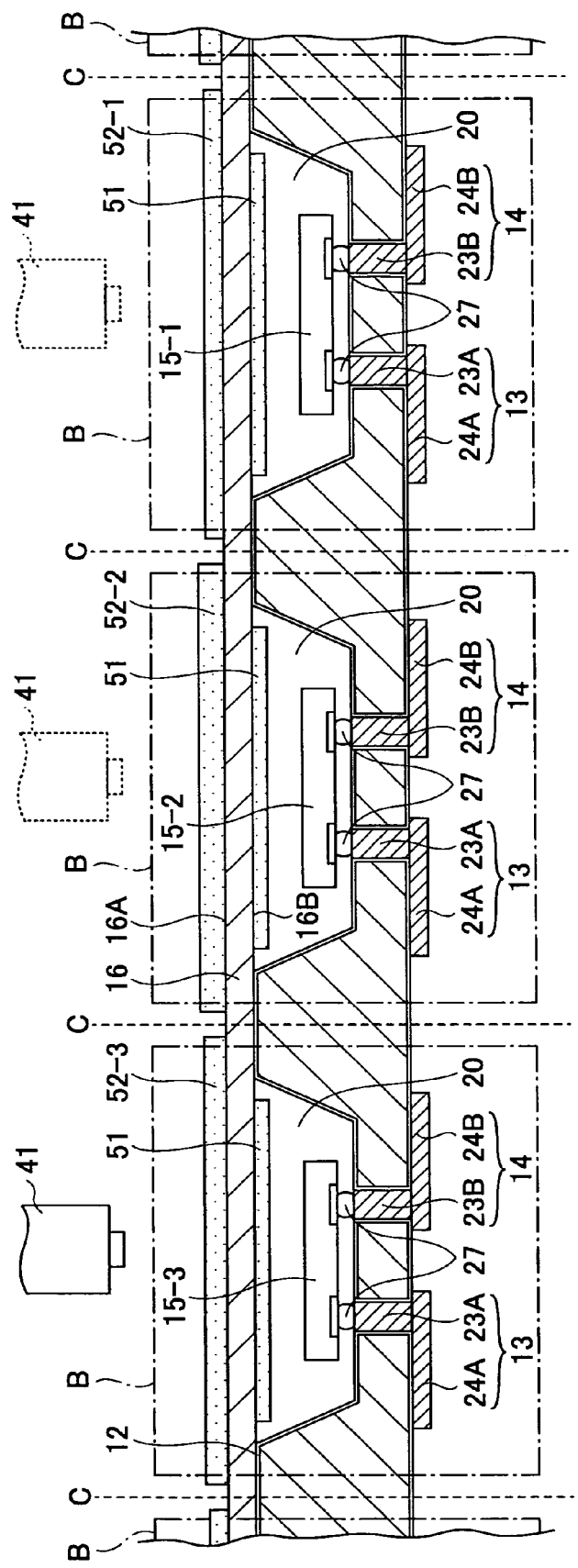
FIG. 20 is a third drawing illustrating the exemplary method of producing the exemplary light emitting apparatus according to the second embodiment of the present invention.

In a step shown in FIG. 20, a voltage is applied between the electrodes 26A and 26B to cause the light emitting elements 15-1 through 15-3 one by one to emit light. Each of second fluorescent-substance-containing resins 52-1 through 52-3 is formed on the side 16A (the side opposite to the side 16B that faces the recess 20) of the translucent substrate 16 while measuring the luminance and chromaticity of the light transmitted by the corresponding pair of the first fluorescent-substance-containing resins 51 and the second fluorescent-substance-containing resins 52-1 through 52-3 (light emitted from a corresponding one of the light emitting apparatuses 50-1 through 50-3) with the measuring device 41 so that the measurement results match the specified luminance and chromaticity (fluorescent-substance-containing resin forming step). Each of the second fluorescent-substance-containing resins 52-1 through 52-3 has substantially the same configuration as that of the second fluorescent-substance-containing resin 52 shown in FIG. 17 except that the second fluorescent-substance-containing resins 52-1 through 52-3 have different thicknesses.

In this embodiment, as described above, the light emitting elements 15-1 through 15-3 are caused to emit light one by one. Each of the fluorescent-substance-containing resins 52-1 through 52-3 is formed while measuring the luminance and chromaticity of the light transmitted by the corresponding pair of the first fluorescent-substance-containing resins 51 and the second fluorescent-substance-containing resins 52-1 through 52-3 (light emitted from a corresponding one of the light emitting apparatuses 50-1 through 50-3) until it reaches a certain thickness at which the measurement results match the specified luminance and chromaticity. Such a production method makes it possible to improve the yield rate of the light emitting apparatuses 50-1 through 50-3.

The second fluorescent-substance-containing resins 52-1 through 52-3 may be formed, for example, by inkjet printing. Using inkjet printing makes it easier to adjust the thicknesses of the second fluorescent-substance-containing resins 52-1 through 52-3.

As the measuring device 41, for example, a chroma meter such as CS-200 (Konica Minolta Sensing, Inc.) may be used.

In a step shown in FIG. 21, the structure shown in FIG. 20 is cut into pieces along the cutting positions C. As a result, the light emitting apparatuses 50-1 through 50-3 that can emit light of specified luminance and chromaticity are produced. To cut the structure shown in FIG. 20, for example, a dicer may be used.

In this embodiment, as described above, the light emitting elements 15-1 through 15-3 are caused to emit light one by one. Each of the fluorescent-substance-containing resins 52-1 through 52-3 is formed while measuring the luminance and chromaticity of the light transmitted by the corresponding pair of the first fluorescent-substance-containing resins 51 and the second fluorescent-substance-containing resins 52-1 through 52-3 (light emitted from a corresponding one of the light emitting apparatuses 50-1 through 50-3) until it reaches a certain thickness at which the measurement results match the specified luminance and chromaticity. Such a production method makes it possible to improve the yield rate of the light emitting apparatuses 50-1 through 50-3.

The light emitting apparatus 50 according to the second embodiment may also include a reflector (for example, a metal film) on the inner wall 19B of the frame part 19 to reflect the light emitted from the light emitting element 15. The above production method may also be applied to a light emitting apparatus with such a configuration.

In each of the light emitting apparatuses 10, 10-1 through 10-3, 50, and 50-1 through 50-3 according to the first and second embodiments, the light emitting element 15 (, 15-1, 15-2, or 15-3) and the wiring patterns 13 and 14 are connected by using a flip chip technique. However, the light emitting element 15 (, 15-1, 15-2, or 15-3) and the wiring patterns 13 and 14 may be connected by wire bonding.

Embodiments of the present invention provide a method of producing a light emitting apparatus that makes it possible to adjust the thickness of a fluorescent-substance-containing resin so that the light emitted from a light emitting apparatus attains the specified luminance and chromaticity and thereby to improve the yield rate of light emitting apparatuses.

The present invention is not limited to the specifically disclosed embodiments, and variations and modifications may be made without departing from the scope of the present invention.

The present application is based on Japanese Priority Application No. 2006-015449, filed on Jan. 24, 2006, the entire contents of which are hereby incorporated herein by reference.

What is claimed is:

1. A method of producing a light emitting apparatus including a light emitting element, a light emitting element housing having a recess for housing the light emitting element, and a translucent substrate placed on the light emitting element housing and having a first side facing outward and a second side facing the recess, said method comprising:

a fluorescent-substance-containing resin forming step of forming a fluorescent-substance-containing resin on the first side of the translucent substrate; wherein luminance and chromaticity of light that is emitted from the light emitting element and then transmitted by the fluorescent-substance-containing resin are measured, and a thickness of the fluorescent-substance-containing resin is adjusted based on the measured luminance and chromaticity so that light emitted from the light emitting apparatus attains specified luminance and chromaticity.

2. The method as claimed in claim 1, wherein the fluorescent-substance-Containing resin is formed so as to completely cover the first side of the translucent substrate.

3. The method as claimed in claim 1, wherein the fluorescent-substance-containing resin is formed by inkjet printing.

4. A method of producing a light emitting apparatus including a light emitting element, a light emitting element housing having a recess for housing the light emitting element, and a translucent substrate placed on the light emitting element housing and having a first side facing outward and a second side facing the recess, said method comprising the steps of:
    forming a first layer of fluorescent-substance-containing resin on the second side of the translucent substrate; and
    forming a second layer of fluorescent-substrate-containing resin on the first side of the translucent substrate; wherein
  luminance and chromaticity of light that is emitted from the light emitting element and then transmitted by the first and second layers of fluorescent-substance-containing resin are measured and a thickness of the second layer of fluorescent-substance-containing resin adjusted based on the measured luminance and chromaticity so that light emitted from the light emitting apparatus attains specified luminance and chromaticity.

* * * * *